(12) United States Patent
Chen et al.

(10) Patent No.: US 12,119,039 B2
(45) Date of Patent: Oct. 15, 2024

(54) REFRESH CONTROL CIRCUIT AND METHOD, AND MEMORY

(71) Applicant: CHANGXIN MEMORY TECHNOLOGIES, INC., Hefei (CN)

(72) Inventors: Jixing Chen, Hefei (CN); Liang Chen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 162 days.

(21) Appl. No.: 17/935,746

(22) Filed: Sep. 27, 2022

(65) Prior Publication Data

US 2023/0420026 A1 Dec. 28, 2023

Related U.S. Application Data

(63) Continuation of application No. PCT/CN2022/107097, filed on Jul. 21, 2022.

(30) Foreign Application Priority Data

Jun. 23, 2022 (CN) .......................... 202210724803.6

(51) Int. Cl.
*G11C 7/00* (2006.01)
*G11C 11/406* (2006.01)
*G11C 11/408* (2006.01)

(52) U.S. Cl.
CPC ... *G11C 11/40622* (2013.01); *G11C 11/40611* (2013.01); *G11C 11/4087* (2013.01)

(58) Field of Classification Search
CPC ................................................. G11C 11/40622
(Continued)

(56) References Cited

U.S. PATENT DOCUMENTS

| 6,469,947 B2 | 10/2002 | Park |
| 8,284,614 B2 | 10/2012 | Shim |

(Continued)

FOREIGN PATENT DOCUMENTS

| CN | 102655022 A | 9/2012 |
| CN | 102655023 A | 9/2012 |

(Continued)

OTHER PUBLICATIONS

International Search Report in the international application No. PCT/CN2022/107097, mailed on Mar. 15, 2023.

(Continued)

*Primary Examiner* — Hoai V Ho
(74) *Attorney, Agent, or Firm* — Syncoda LLC; Feng Ma

(57) ABSTRACT

A refresh control circuit includes the following: an address output circuit configured to output a to-be-refreshed address signal including a block address signal and a row address signal; a block decoding circuit configured to: receive the block address signal; decode the block address signal and output a first block selection signal for selecting multiple data blocks from the memory array, in response to that the memory array is subjected to no row hammer attack, or decode the block address signal and output a second block selection signal for selecting one data block from the memory array, in response to that the memory array is subjected to a row hammer attack; and a row decoding circuit, configured to receive the row address signal, decode the row address signal and output a row selection signal.

20 Claims, 7 Drawing Sheets

(58) Field of Classification Search
USPC .......................................................... 365/222
See application file for complete search history.

(56) References Cited

U.S. PATENT DOCUMENTS

| | | | |
|---|---|---|---|
| 8,284,615 | B2 | 10/2012 | Shim |
| 10,607,683 | B2 | 3/2020 | Shin |
| 11,152,050 | B2 | 10/2021 | Morohashi |
| 2002/0002696 | A1 | 1/2002 | Park |
| 2012/0163106 | A1 | 6/2012 | Shim |
| 2012/0163111 | A1 | 6/2012 | Shim |
| 2019/0221251 | A1 | 7/2019 | Nakaoka |
| 2019/0333573 | A1 | 10/2019 | Shin et al. |
| 2019/0385667 | A1 | 12/2019 | Morohashi et al. |
| 2020/0211633 | A1* | 7/2020 | Okuma ............... G06F 12/0646 |
| 2020/0219556 | A1 | 7/2020 | Ishikawa et al. |
| 2021/0350844 | A1 | 11/2021 | Morohashi et al. |

FOREIGN PATENT DOCUMENTS

| | | |
|---|---|---|
| CN | 110400586 A | 11/2019 |
| CN | 112236822 A | 1/2021 |
| CN | 114649023 A | 6/2022 |

OTHER PUBLICATIONS

Supplementary European Search Report in application No. 22834833, mailed on May 28, 2024.

* cited by examiner

REFRESH CONTROL CIRCUIT AND METHOD, AND MEMORY

CROSS-REFERENCE TO RELATED APPLICATIONS

This is a continuation of International Application No. PCT/CN2022/107097 filed on Jul. 21, 2022, which claims priority to Chinese Patent Application No. 202210724803.6 filed on Jun. 23, 2022. The disclosures of the above-referenced applications are hereby incorporated by reference in their entirety.

BACKGROUND

Row Hammer attacks are a kind of data attacks directed at a Dynamic Random Access Memory (DRAM), which cause data loss of adjacent Word Lines (WLs) (hereinafter referred to as victim WL) by frequently refreshing a certain WL (hereinafter referred to as hammer WL) in a short time. At present, when a row hammer attack is detected, the victim WLs need to be refreshed to recover the affected data, also known as a hammer refresh operation. However, the hammer refresh operation needs to be implemented by means of a general refresh operation process, which causes some irrelevant WLs to be additionally refreshed during the hammer refresh process, resulting in a waste of resources and reducing the performance of the memory.

SUMMARY

The present disclosure relates to the technical field of semiconductor memories, in particular to a refresh control circuit and method, and a memory.

The technical solutions of the present disclosure are implemented as follows.

In a first aspect, embodiments of the present disclosure provide a refresh control circuit. The refresh control circuit is connected with a memory array and includes: an address output circuit, a block decoding circuit, and a row decoding circuit.

The address output circuit may be configured to output a to-be-refreshed address signal. The to-be-refreshed address signal includes a block address signal and a row address signal. The block decoding circuit is configured to receive the block address signal, decode the block address signal and output a first block selection signal, in response to that the memory array is subjected to no row hammer attack, or decode the block address signal and output a second block selection signal, in response to that the memory array is subjected to a row hammer attack. Herein, the first block selection signal is used for selecting multiple data blocks from the memory array, and the second block selection signal is used for selecting one data block from the memory array. The row decoding circuit may be configured to receive the row address signal, decode the row address signal, and output a row selection signal. The row selection signal is used for selecting a target refresh word line (WL) from the one data block selected by the second block selection signal, or selecting target refresh WLs from the multiple data blocks selected by the first block selection signal.

In a second aspect, the embodiments of the present disclosure provide a refresh control method, which is applied to a refresh control circuit and connected with a memory array. The method may include the following operations.

A to-be-refreshed address signal is determined. The to-be-refreshed address signal includes a block address signal and a row address signal. The block address signal is decoded to obtain a first block selection signal, in response to that the memory array is subjected to no row hammer attack. The block address signal is decoded to obtain a second block selection signal, in response to that the memory array is subjected to a row hammer attack. Herein, the first block selection signal may be used for selecting multiple data blocks from the memory array, and the second block selection signal may be used for selecting one data block from the memory array. The row address signal is decoded to obtain a row selection signal. The row selection signal is used for selecting a target refresh word line (WL) from the one data block selected by the second block selection signal, or selecting target refresh WLs from the multiple data blocks selected by the first block selection signal. The target refresh WL(s) is (are) refreshed.

In a third aspect, the embodiments of the present disclosure provide a memory, which may include a refresh control circuit as described in a first aspect and a memory array. The refresh control circuit is connected with the memory array.

DETAILED DESCRIPTION

Figure 1:
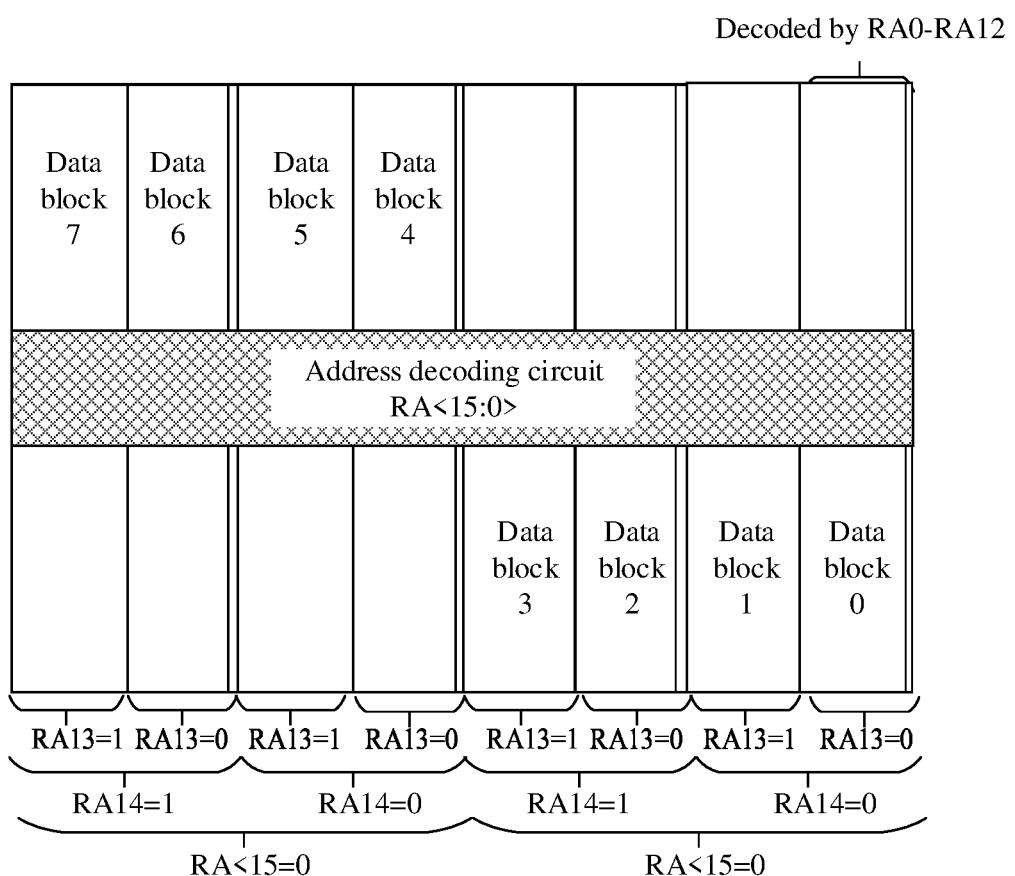
FIG. 1 illustrates a schematic structural diagram of a memory array.

The technical solutions in the embodiments of the present disclosure will be clearly and completely described in conjunction with the drawings in the embodiments of the present disclosure. It is understandable that the specific embodiments described herein are only used to illustrate the relevant disclosure, but are not intended to limit the disclosure. In addition, it is to be noted that, for the convenience of description, only the parts related to the relevant disclosure are shown in the drawings. Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure. In the following description, reference is made to "some embodiments" which describe a subset of all possible embodiments, but it is understandable that "some embodiments" may be the same or different subsets of all possible embodiments, and may be combined with each other without conflict. It is to be noted that the terms "first\second\third" involved in the embodiments of the present disclosure are only used to distinguish similar objects, and do not represent a specific order of the objects. It is understandable that the specific order or sequence of "first\second\third" may be interchangeable under the allowable circumstances, so that the embodiments of the disclosure described herein may be implemented in an order other than those illustrated or described herein.

A DRAM needs to maintain data in a memory cell through a refresh operation. In a general refresh operation, each refresh operation may enable multiple data blocks in a memory array, and a WL is further selected from the enabled data blocks for refresh processing. Referring to FIG. 1, FIG. 1 illustrates a schematic structural diagram of a memory array. As illustrated in FIG. 1, the memory array is divided into: a data block 0, a data block 1 . . . a data block 7. An address signal in the refresh operation may be expressed as RA<15:0>. Herein, RA<15:13> is a block address signal used for selecting the data block that needs to be enabled. RA<12:0> is a row address signal used for selecting a target refresh WL from the enabled data block. In a general refresh operation, RA14, RA14B, RA15, and RA15B are all forced to be at a high level, where "B" represents an inverted signal. Since "RA14=0" is represented as "RA14=1" in circuit decoding, it may be considered that RA14=1, RA14=0, RA15=1, and RA15=0 are all valid. Taking RA<15:13>=000 as an example, since the data block 0, the data block 2, the data block 4 and the data block 6 all use Ra13B as a block preselection signal, and Ra14 and Ra15 and their inverted signals are forced to 1, the data block is actually only selected based on Ra13. Since the even stages of data blocks (the data blocks 0, 2, 4, and 6) use Ra13B, when Ra13=0, the even stages of data blocks are selected. That is, in the general refresh operation, the corresponding WLs (decoded by RA<12:0>) are selected from 4 data blocks for refresh each time. In particular, in memory arrays with different storage capacities, the number of data blocks and the decoding process may be different; in this case, the number of selected data blocks is also different. FIG. 1 is only an example.

However, when a row hammer attack is detected, a Victim WL needs to be refreshed to restore the affected data, and hammer refresh needs to be implemented by means of the general refresh process. Taking FIG. 1 as an example, it is assumed that the victim WL is a WL in the data block 0, but due to the aforementioned decoding mechanism, the data block 0, the data block 2, the data block 4 and the data block 6 are still all selected, rendering that some irrelevant WLs of the memory may also be refreshed additionally during the hammer refresh process, resulting in a waste of resources and reducing the performance of the memory.

The embodiments of the present disclosure provide a refresh control circuit, which may reduce the number of irrelevant WLs being refreshed in a hammer refresh operation and reduce refresh current and power consumption, thereby improving the performance of the memory.

The embodiments of the present disclosure will be described in detail below with reference to the accompanying drawings.

Figure 2:
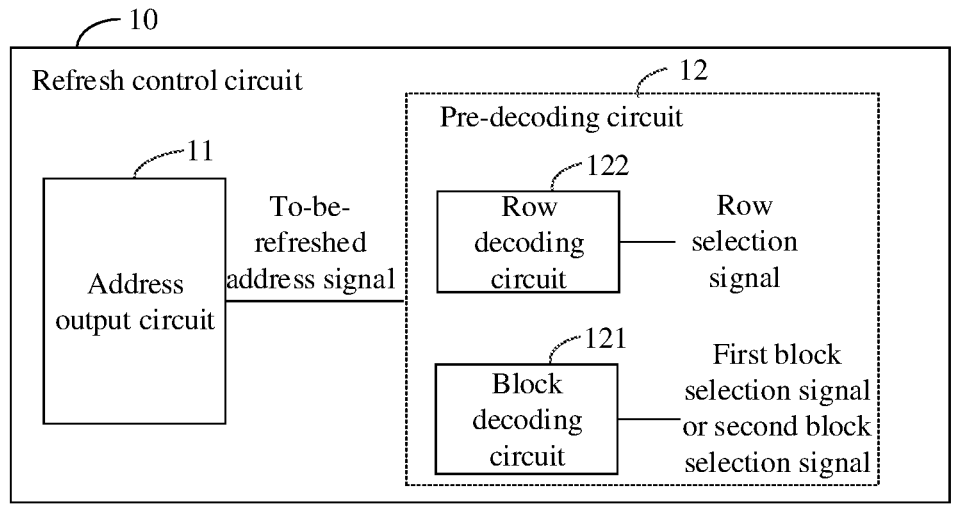
FIG. 2 illustrates a schematic structural diagram of a refresh control circuit according to an embodiment of present disclosure.

In an embodiment of the present disclosure, referring to FIG. 2, FIG. 2 illustrates a schematic structural diagram of a refresh control circuit 10 according to an embodiment of the present disclosure. The refresh control circuit 10 is connected with a memory array. As illustrated in FIG. 2, the refresh control circuit 10 may include: an address output circuit 11, a block decoding circuit 121, and a row decoding circuit 122.

The address output circuit 11 is configured to output a to-be-refreshed address signal. The to-be-refreshed address signal includes a block address signal and a row address signal.

The block decoding circuit 121 is configured to: receive the block address signal; decode the block address signal and output a first block selection signal, in response to that the memory array is subjected to no row hammer attack, or decode the block address signal and output a second block selection signal, in response to that the memory array is subjected to a row hammer attack. Herein, the first block selection signal is used for selecting multiple data blocks from the memory array, and the second block selection signal is used for selecting one data block from the memory array.

The row decoding circuit 122 is configured to receive the row address signal, decode the row address signal, and output a row selection signal. The row selection signal is used for selecting a target refresh WL from the one data block selected by the second block selection signal, or selecting target refresh WLs from the multiple data blocks selected by the first block selection signal.

It is to be noted that, the refresh control circuit 10 in the embodiments of the present disclosure is applied to a dynamic memory to solve the problem of relatively high refresh power consumption in the hammer refresh operation.

Here, the address output circuit 11 is configured to output the to-be-refreshed address signal, and the to-be-refreshed address signal is configured to indicate a WL address that needs to be refreshed. The block decoding circuit 121 and the row decoding circuit 122 together form a pre-decoding circuit 12, and are configured to preliminarily decode the to-be-refreshed address signal to obtain the row selection signal and the block selection signal. The row decoding signal and the block decoding signal are configured to enable the target refresh WL after subjecting to subsequent processing.

In the embodiments of the present disclosure, the block selection signal includes two types: the first block selection signal and the second block selection signal. In the general refresh operation (that is, the memory array is subjected to no row hammer attack), the block selection signal is the first block selection signal capable of selecting multiple data blocks, so that the corresponding WLs are selected from the multiple data blocks for refresh. In the hammer refresh operation (that is, the memory array is subjected to a row hammer attack), the block selection signal is the second block selection signal that selects only one data block, so that the corresponding WL is only selected from one data block for refresh, which may reduce the number of the irrelevant WLs being refreshed, reduce the current and power consumption during the hammer refresh process, and improve the performance of the memory.

It is to be noted that the actual meaning of a block address represented by the block address signal may be adjusted according to the actual situation. Specifically, when a selection object is a certain bank or a half bank, the block address signal represents a section obtained by segmenting the bank in a direction of a bit line. As illustrated in FIG. 1, the upper and lower regions of the address decoding circuit are both half banks, which together form a complete bank. Each half bank may be divided into 8 data blocks. In general refresh, multiple WLs of some sections in the same half bank are refreshed at the same time, and each section generally has at most one WL. When the selection object is the entire chip, the actual meaning of the block address represented by the block address signal may be a bank address; in this case, during the general refresh, multiple WLs of some banks of the same chip are refreshed at the same time, and each bank generally has at most one WL. Further, when the selection object is the entire chip, the actual meaning represented by the block address signal may include the bank address and the section address; in this case, during the general refresh, the WLs of multiple sections of some banks in the same chip are refreshed at the same time, that is, multiple WLs in any selected bank are refreshed at the same time. All in all, the memory grade represented by the block address signal may be adjusted according to actual needs and subsequent changes in capacity and specifications, and illustrative description is only made herein.

It is to be noted that the specific number of data blocks selected by the first block selection signal may be determined according to an actual application scenario. With the memory array illustrated in FIG. 1 as an example, the first block selection signal selects 4 data blocks each time, which however does not constitute relevant limitation.

Figure 3:
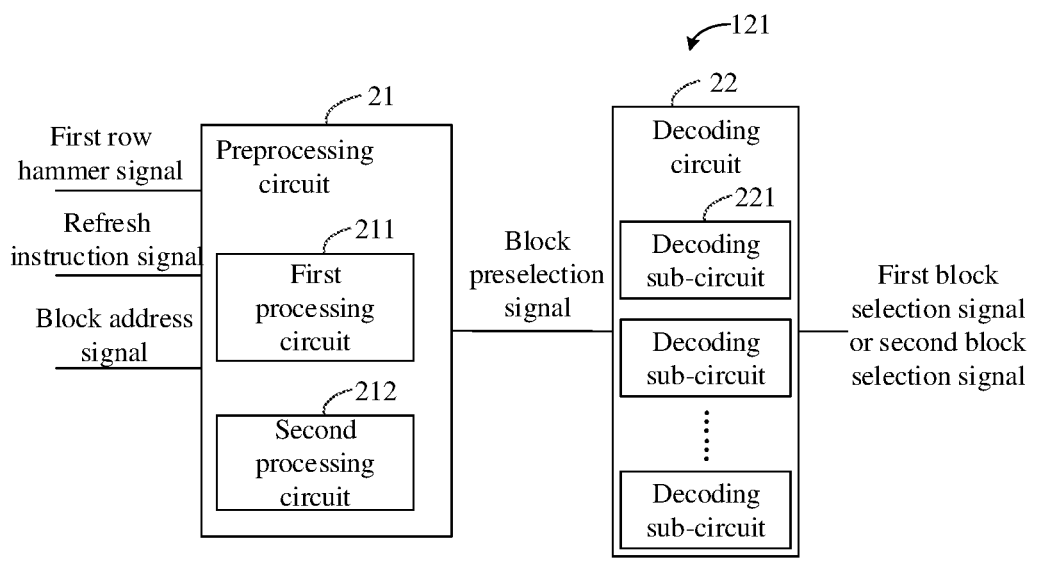
FIG. 3 illustrates a schematic structural diagram of a block decoding circuit according to an embodiment of present disclosure.

In some embodiments, as illustrated in FIG. 3, the block decoding circuit 121 includes: a preprocessing circuit 21 and a decoding circuit 22.

The preprocessing circuit 21 is configured to receive: a first row hammer signal, a refresh instruction signal and the block address signal; and in response to that the first row hammer signal is invalid, perform first preprocessing on the block address signal based on the refresh instruction signal to obtain a block preselection signal, or in response to that the first row hammer signal is valid, perform second preprocessing based on the block address signal to obtain the block preselection signal.

The decoding circuit 22 is configured to receive the block preselection signal, and decode the block preselection signal to obtain the first block selection signal or the second block selection signal.

It is to be noted that, in response to that the memory array is subjected to no row hammer attack, the first row hammer signal is invalid. In response to that the memory array is subjected to a row hammer attack, the first row hammer signal is valid. In addition, the refresh instruction signal is configured to instruct execution of the refresh operation.

In this way, the first row hammer signal is used to distinguish this refresh operation as the general refresh operation or the hammer refresh operation, and the first block selection signal or the second block selection signal is obtained by subsequent decoding using a corresponding preprocessing method. The number of irrelevant WLs being refreshed in the hammer refresh operation can be reduced without affecting the general refresh operation, and the refresh current and power consumption in the hammer refresh operation can be reduced.

In some embodiments, the block address signal includes a first-type signal and a second-type signal. The first-type signal and the second-type signal together form the block address signal. The block preselection signal includes a first signal pair and a second signal pair. As illustrated in FIG. 3, the preprocessing circuit 21 includes: a first processing circuit 211 and a second processing circuit 212.

The first processing circuit 211 is configured to receive the first-type signal, perform logical processing on the first-type signal, and output the first signal pair. Herein, the first signal pair includes the first-type signal and an inverted signal of the first-type signal, and a level state of the first-type signal is opposite to a level state of the inverted signal of the first-type signal.

The second processing circuit 212 is configured to receive the first row hammer signal, the refresh instruction signal and the second-type signal; and perform the first preprocessing or the second preprocessing on the second-type signal based on the first row hammer signal and the refresh instruction signal, and output the second signal pair. Herein, the second signal pair may include the second-type signal and an inverted signal of the second-type signal. In response to that the first row hammer signal is valid, a level state of the second-type signal is opposite to a level state of the inverted signal of the second-type signal. In response to that the first row hammer signal is invalid and the refresh instruction signal is valid, the second-type signal and the inverted signal of the second-type signal are both set to be in a high-level state.

A specific example is provided below to describe the decoding process of the to-be-refreshed address signal in detail. In the example, the to-be-refreshed address signal is composed of 16 sub-signals, which may be expressed as RA<15:0>. Herein, RA<15:13> is the block address signal used for selecting the data block; and RA<12:0> is the row address signal used for selecting the WL.

Referring to FIG. 1, the first-type signal refers to RA<13>, which is processed by the first processing circuit 211 into the first signal pair (RA13/RA13B). At this time, the level state of RA13 is the same as that of RA<13>, and the level state of RA13B is opposite to that of RA<13>.

The second-type signal refers to RA<14> and RA<15>, which is processed by the second processing circuit 212 into a second signal pair (RA14/RA14B, RA15/RA15B). In the hammer refresh operation, the level state of RA14 is the same as that of RA<14>, the level state of RA14B is opposite to that of RA<14> are opposite, the level state of RA15 is the same as that of RA<15>, and the level state of RA15B is opposite to that of RA<15>. In the general refresh operation, RA14, RA14B, RA15, and RA15B are all set to be at a high-level state, and represented to be selected. It is understandable that, in other embodiments, RA14, RA14B, RA15, and RA15B may also be set to represent other selected level states.

In particular, RA13, RA13B, RA14, RA14B, RA15, and RA15B are all synchronized chronologically so as to jointly perform subsequent decoding.

It is understandable that the first-type signal RA<13> and the first-type signal RA13 have the same meaning in a circuit, and therefore they are distinguished only by symbols with no additional name introduced. It is similar for RA<14> and RA14, and RA<15> and RA15. In addition, in memories with different storage capacities, the number of data blocks and division rules in the memory array may be different, and the number of data blocks that need to be controlled to be enabled is different, then the data bits of the first-type signal and the second-type signal need to be correspondingly adjusted in this case. The embodiment of the present disclosure is only an example but does not constitute a specific limitation.

Figure 4:
FIG. 4 illustrates a schematic structural diagram of a first processing circuit according to an embodiment of present disclosure.

In some embodiments, as illustrated in FIG. 4, the first processing circuit 211 includes a first NOT gate. An input end of the first NOT gate receives the first-type signal RA<13>, and an output end of the first NOT gate outputs the inverted signal RA13B of the first-type signal.

It is to be noted that, the first processing circuit 211 may also be provided with a delay device configured to delay the first-type signal RA<13>, so as to ensure that the first-type signal RA13 and the inverted signal RA13B of the first-type signal that are synchronous chronologically are obtained.

It is also to be noted that there is only one first-type signal in FIG. 4, and therefore the number of the first NOT gate is one. In a case where there are multiple first-type signals, the number of the first NOT gates may be multiple, so as to process different first-type signals in parallel. Alternatively, in a case where there are multiple first-type signals, only one first NOT gate may be still set; and different first-type signals are processed serially through the delay device, and then another delay device is used to ensure that all first-type signals and the inverted signals of the first-type signals are synchronized chronologically.

Figure 5:
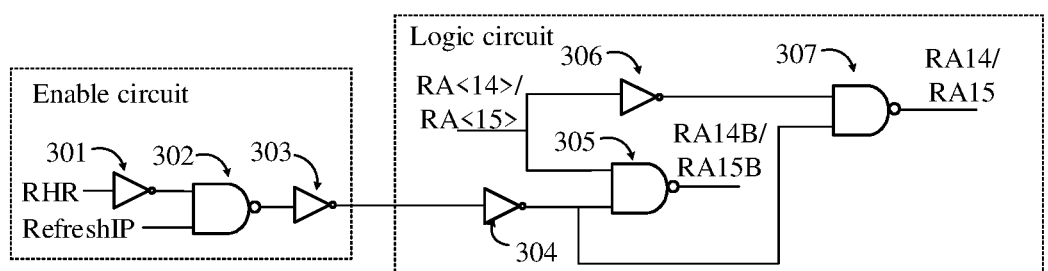
FIG. 5 illustrates a schematic structural diagram of a second processing circuit according to an embodiment of present disclosure.

In some embodiments, as illustrated in FIG. 5, the second processing circuit 212 includes: an enable circuit and a logic circuit.

The enable circuit is configured to receive the first row hammer signal RHR and the refresh instruction signal RefreshIP, and output an operation control signal. Herein, in response to that the first row hammer signal RHR is invalid and the refresh instruction signal RefreshIP is valid, the operation control signal is valid. In response to that the first row hammer signal RHR is valid, the operation control signal is invalid.

The logic circuit is configured to receive the operation control signal and the second-type signal; perform the first preprocessing on the second-type signal and output the second signal pair, in response to that the operation control signal is valid; and perform the second preprocessing on the second-type signal and output the second signal pair, in response to that the operation control signal is invalid.

That is, when the memory array is subjected to a row hammer attack, the valid first row hammer signal RHR may "disable" the refresh instruction signal RefreshIP to obtain an invalid operation control signal, so that second preprocessing is performed on the second-type signal to obtain the second signal pair, and then a second block decoding signal is obtained by decoding. The WL is only selected from one data block for refresh processing, so that the power consumption of hammer refresh is reduced.

Similarly, in a case where there is one second-type signal, the second processing circuit 212 may include one enable circuit and one logic circuit. In a case where there are multiple second-type signals, as illustrated in FIG. 5, the enable circuit and the logic circuit may process different second-type signals serially, and then ensure that all the second-type signals and the inverted signals of the second-type signals are synchronized chronologically through another delay device. Alternatively, in a case where there are multiple second-type signals, the second processing circuit 212 may include multiple sets of circuits as illustrated in FIG. 5, each for processing one respective second-type signal.

Due to the diversity of circuit devices, there are various possibilities for the specific composition of the second processing circuit, as long as the aforementioned circuit logic can be implemented. The specific composition of the second processing circuit 212 is exemplarily provided below.

In some embodiments, the enable circuit includes a second NOT gate 301, a first NAND gate 302 and a third NOT gate 303. Herein, an input end of the second NOT gate 301 receives the first row hammer signal RHR, a first input end of the first NAND gate 302 is connected with an output end of the second NOT gate 301, a second input end of the first NAND gate 302 receives the refresh instruction signal RefreshIP, an output end of the first NAND gate 302 is connected with the input end of the third NOT gate 303, and an output end of the third NOT gate 303 is configured to output the operation control signal.

In some embodiments, as illustrated in FIG. 5, the logic circuit may include a fourth NOT gate 304, a second NAND gate 305, a fifth NOT gate 306, and a third NAND gate 307. Herein, the fourth NOT gate 304 receives the operation control signal, a first input end of the second NAND gate 305 is connected with an output end of the fourth NOT gate 304, a second input end of the second NAND gate 305 receives the second-type signal, and an output end of the second NAND gate 305 is configured to output the inverted signal of the second-type signal. An input end of the fifth NOT gate 306 receives the second-type signal, a first input end of the third NAND gate 307 is connected with an output end of the fourth NOT gate 304, a second input end of the third NAND gate 307 is connected with an output end of the fifth NOT gate 306, and an output end of the third NAND gate 307 is configured to output a new second-type signal.

It is to be noted that, taking the second-type signal RA<14> as an example, in response to that the first row hammer signal RHR is valid, the operation control signal is invalid, the level state of RA14B output by the second NAND gate 305 is opposite to that of RA<14>, and the level state of RA14 output by the third NAND gate 307 is the same as that of RA<14>. In response to that the first row hammer signal RHR is invalid and the refresh instruction signal RefreshIP is valid, the operation control signal is valid, and the second NAND gate 305 and the third NAND gate 307 both fixedly output high-level signals, namely RA14B and RA14 are both set to be at a high-level state.

In this way, the block preselection signals RA13, RA13B, RA14, RA14B, RA15 and RA15B are determined by the preprocessing circuit 21. In the general refresh operation, RA14, RA14B, RA15 and RA15B are all set to be at a high-level state. In the hammer refresh operation, the level of none of RA14, RA14B, RA15 and RA15B is forced, so as to accurately select the data block where the victim WL is located, thereby reducing the number of the irrelevant WLs being refreshed in the hammer refresh operation.

In some embodiments, the first block selection signal and the second block selection signal each include multiple block selection sub-signals. Among the multiple block selection sub-signals in the first block selection signal, some block selection sub-signals are in a valid state, and the rest block selection sub-signals are in an invalid state, so as to select multiple data blocks from the memory array. Among the multiple block selection sub-signals in the second block selection signal, one block selection sub-signal is in a valid state, and the rest block selection sub-signals are in an invalid state, so as to select one data block from the memory array. In other embodiments, the number of block selection sub-signals in a valid state in the second block selection signal may be controlled to be greater than 1 and smaller than the number of block selection sub-signals in a valid state in the first block selection signal.

Figure 6:
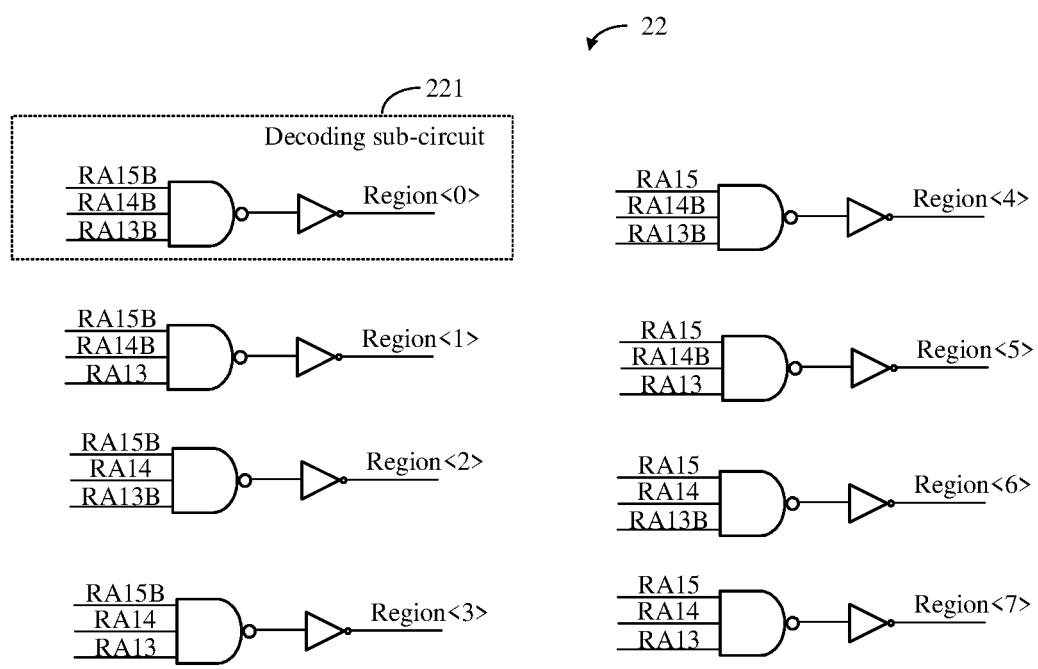
FIG. 6 illustrates a schematic structural diagram of a decoding circuit according to an embodiment of present disclosure.

Exemplarily, the number of block selection sub-signals may be 8; in this case, the first block selection signal and the second block selection signal may be both represented as Region<7:0>. Correspondingly, as illustrated in FIGS. 3 and 6, the decoding circuit 22 includes multiple decoding sub-circuits 221 (In FIGS. 3 and 6, only one decoding sub-circuit is labeled as an example). Each of the multiple decoding sub-circuits 221 is configured to receive some signals in the block preselection signal, perform logical operation on the received signals, and output a respective block selection sub-signal (such as Region<0>). It is understandable that each of the multiple decoding sub-circuits 221 receive respective different signals, and outputs a respective different block selection sub-signal.

Herein, in response to that a result of the logic operation is a preset value, the block selection sub-signal output by the decoding sub-circuit 221 is in a valid state. Exemplarily, the preset value may be 1 (high-level signal).

In some embodiments, as illustrated in FIG. 6, the decoding sub-circuit 221 includes a fourth NAND gate and a sixth NOT gate. Herein, an input end of the fourth NAND gate is configured to receive some signals in the block preselection signal, an output end of the fourth NAND gate is connected with an input end of the sixth NOT gate, and an output end of the sixth NOT gate is configured to output the block selection sub-signal.

It is to be noted that the specific signals received by each decoding sub-circuit 221 need to be decided according to the actual decoding rule, and FIG. 6 is only an example. Assuming that RA<15:13>=000, in the absence of row hammer attacks, RA15=RA15B=RA14=RA14B=1, RA13=0, RA13B=1. In this case, Region<0>=Region<2>=Region<4>=Region<6>=1 (equivalent to a valid state), that is, the data block 0, the data block 2, the data block 4, and the data block 6 are selected. In a case of a row hammer attack, RA15=0, RA15B=1, RA14=0, RA14B=1, RA13=0, RA13B=1; in this case, only Region<0>=1, that is, only the data block 0 is selected. It can be seen that through a calibration control circuit provided by the embodiments of the present disclosure, only the data block where the victim WL is located can be selected for the refresh operation during the hammer refresh, so that the refresh of irrelevant WLs and power consumption are reduced.

Figure 7:
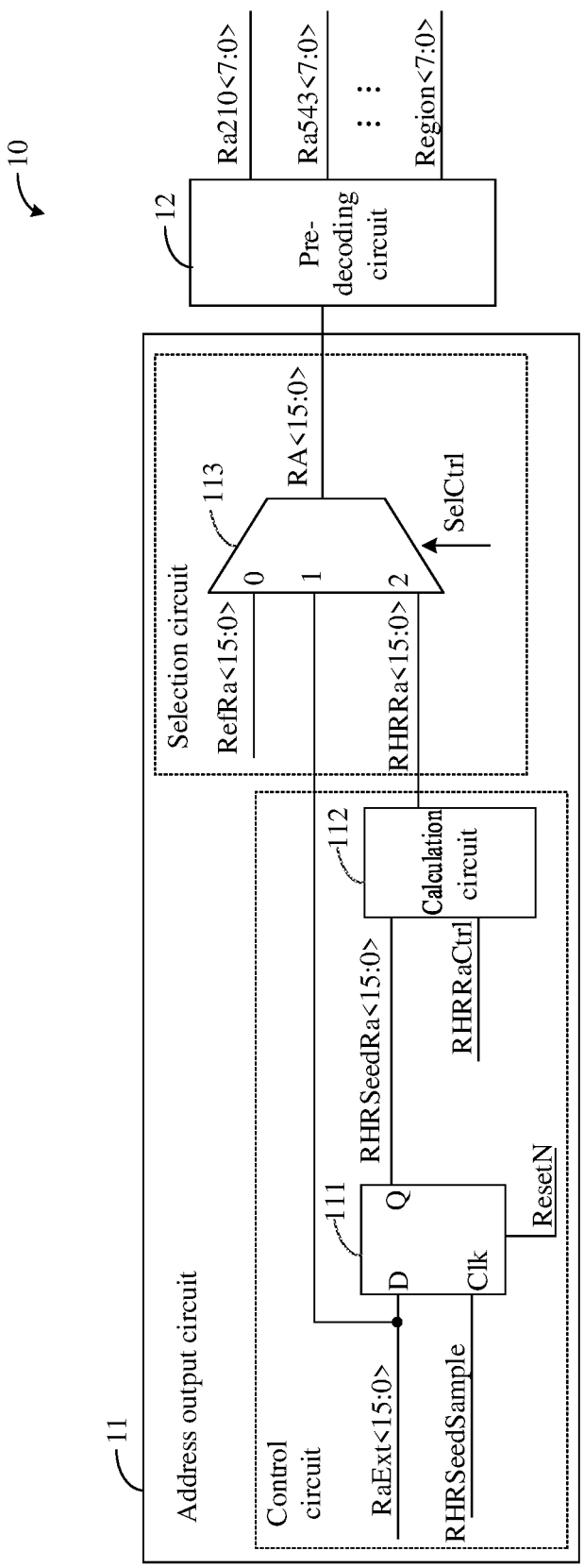
FIG. 7 illustrates a schematic structural diagram of another refresh control circuit according to an embodiment of present disclosure.

In some embodiments, as illustrated in FIG. 7, the address output circuit 11 is specifically configured to receive a general refresh address signal RefRa<15:0> and an activation address signal RaExt<15:0>; and in response to that the memory array is subjected to no row hammer attack, output the general refresh address signal RefRa<15:0> as the to-be-refreshed address signal RA<15:0>, or in response to that the memory array is subjected to a row hammer attack, output the to-be-refreshed address signal RA<15:0> based on the activation address signal RaExt<15:0>.

It is to be noted that, the general refresh address signal RefRa<15:0> refers to an address signal in the general refresh operation, and the activation address signal RaExt<15:0> refers to an address signal in an activation operation. It is understandable that a row hammer attack means that the activation times of a certain WL address in a unit time reaches a threshold value. That is, if the occurrence frequency of the same activation address signal RaExt<15:0> in a unit time reaches the threshold value, it is confirmed that the memory array is subjected to a row hammer attack, and the activation address signal RaExt<15:0> is also the address signal of the hammer WL. In particular, in the row hammer attack scenario, the victim WL is the adjacent WL of the hammer WL; therefore, the to-be-refreshed address signal RA<15:0> needs to be further determined according to the activation address signal RaExt<15:0>.

In some embodiments, as illustrated in FIG. 7, the address output circuit 11 includes: a control circuit and a selection circuit 113.

The control circuit is configured to receive the activation address signal RaExt<15:0>, a second row hammer signal RHRSeedSample and a first control signal RHRRaCtrl; and in response to that the second row hammer signal RHRSeedSample is valid, perform calculation on the activation address signal RaExt<15:0> based on the first control signal RHRRaCtrl and output a victim address signal RHRRa<15:0>.

The selection circuit 113 is configured to receive the general refresh address signal RefRa<15:0>, the victim address signal RHRRa<15:0> and the second control signal SelCtrl; and in response to that the second control signal SelCtrl is in a first state, output the general refresh address signal RefRa<15:0> as the to-be-refreshed address signal RA<15:0>, or in response to that the second control signal SelCtrl is in a second state, output the victim address signal RHRRa<15:0> as the to-be-refreshed address signal RA<15:0>. In addition, the pre-decoding circuit 12 pre-decodes the to-be-refreshed address signal RA<15:0> to obtain the row selection signal (for example, Ra210<7:0>, Ra453<7:0> . . . in FIG. 7) and the block selection signal Region<7:0>, so as to determine the target refresh WL finally.

Here, the victim address signal RHRRa<15:0> is configured to indicate the victim WL in the row hammer attack, the second row hammer signal RHRSeedSample represents that the memory array is subjected to a row hammer attack, and the first control signal RHRRaCtrl is configured to control the related calculation process. In particular, the second row hammer signal RHRSeedSample, the first control signal RHRRaCtrl, the second control signal SelCtrl and the aforementioned first row hammer signal RHR are all related to whether the memory array is subjected to a row hammer attack. Since the positions of these signals in the circuit are different, and the timing problem also needs to be considered in determining the change logic thereof, there may be no fixed logical relationship between them.

In some embodiments, the control circuit includes a latch 111 and a calculation circuit 112. Herein, an input end of the latch 111 receives the activation address signal RaExt<15:0>, a clock end of the latch 111 receives the second row hammer signal RHRSeedSample, an output end of the latch 111 is connected with an input end of the calculation circuit 112, and a control end of the calculation circuit 112 receives the first control signal RHRRaCtrl. A first input end of the selection circuit 113 receives the general refresh address signal RefRa<15:0>, a second input end of the selection circuit 113 is connected with an output end of the calculation circuit 112, a control end of the selection circuit 113 is connected with the second control signal SelCtrl, and an output end of the selection circuit 113 is configured to output the to-be-refreshed address signal RA<15:0>.

In this way, in a case where the second row hammer signal RHRSeedSample is valid, the latch 111 latches the activation address signal RaExt<15:0>, and outputs the hammer address signal RHRSeedRa<15:0>. At the same time, the first control signal RHRRaCtrl is valid, and the calculation circuit 112 calculates the victim address signal RHRRa<15:0> according to the hammer address signal RHRSeedRa<15:0>. Here, the latch 111 is also provided with a reset end, configured to perform a reset operation in response to receiving a reset signal ResetN.

It is to be noted that, the activation address signal RaExt<15:0> may be the most accessed or relatively more accessed row address signal capable of causing the row hammer effect, or may be the activation address signal newly received after the row hammer effect. In this case, the newly received activation address signal is used as the row address signal causing the row hammer effect.

In addition, as illustrated in FIG. 7, the selection circuit 113 is further provided with a third input end. The third input end of the selection circuit 113 is connected with the activation address signal RaExt<15:0>. Correspondingly, in response to that the second control signal SelCtrl is in a third state, the selection circuit 113 may output the activation address signal RaExt<15:0>, and may perform tasks in some special circumstances.

In the embodiments of the present disclosure, "valid" or "invalid" is distinguished by the level states of the signal. For example, a signal being valid may mean that the signal is in a high-level state, and a signal being invalid may mean that the signal is in a low-level state. Alternatively, a signal being valid may mean that the signal is in a low-level state, and a signal being invalid may mean that the signal is in a low-level state. This depends on the actual application scenario, as long as it conforms to the corresponding circuit logic and may perform the corresponding circuit function.

Figure 8:
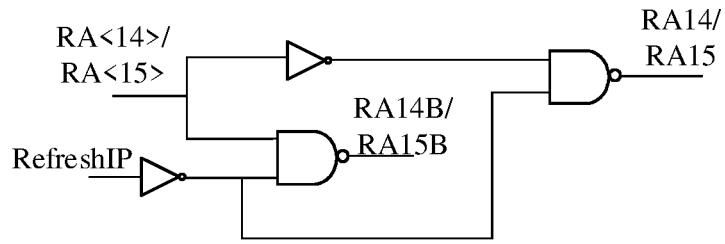
FIG. 8 illustrates a schematic structural diagram of a second processing circuit according to some implementations.

To sum up, the embodiments of the present disclosure provide a refresh control circuit, which can select only the data block where the victim WL is located in the hammer refresh operation, thereby reducing the current and power consumption of the hammer refresh. Referring to FIG. 8, FIG. 8 provides a schematic structural diagram of a second processing circuit. As illustrated in FIG. 8, some block selection signals and their inverted signals (RA14, RA14B, RA15, and RA15B) are set to be high-level signals through the refresh instruction signal RefreshIP, so as to select multiple data block, thus facilitating subsequently selecting the target refresh WL from the multiple data blocks for refresh operation. In the embodiments of the present disclosure, as illustrated in FIG. 5, the enable circuit is added to the second processing circuit 212, and the first row hammer signal identifying whether the present refresh operation is a hammer refresh operation is introduced. The valid first row hammer signal is used to protect the victim WL address, that is, the valid first row hammer signal may Disable the refresh instruction signal RefreshIP, and release the control of the refresh instruction signal RefreshIP on some block selection signals, so that all block selection signals and their inverted signals retain the original control logic, so as to accurately decode the data block where the victim WL is located, only refresh the victim WL, and reduce the current of hammer refresh.

Figure 9:
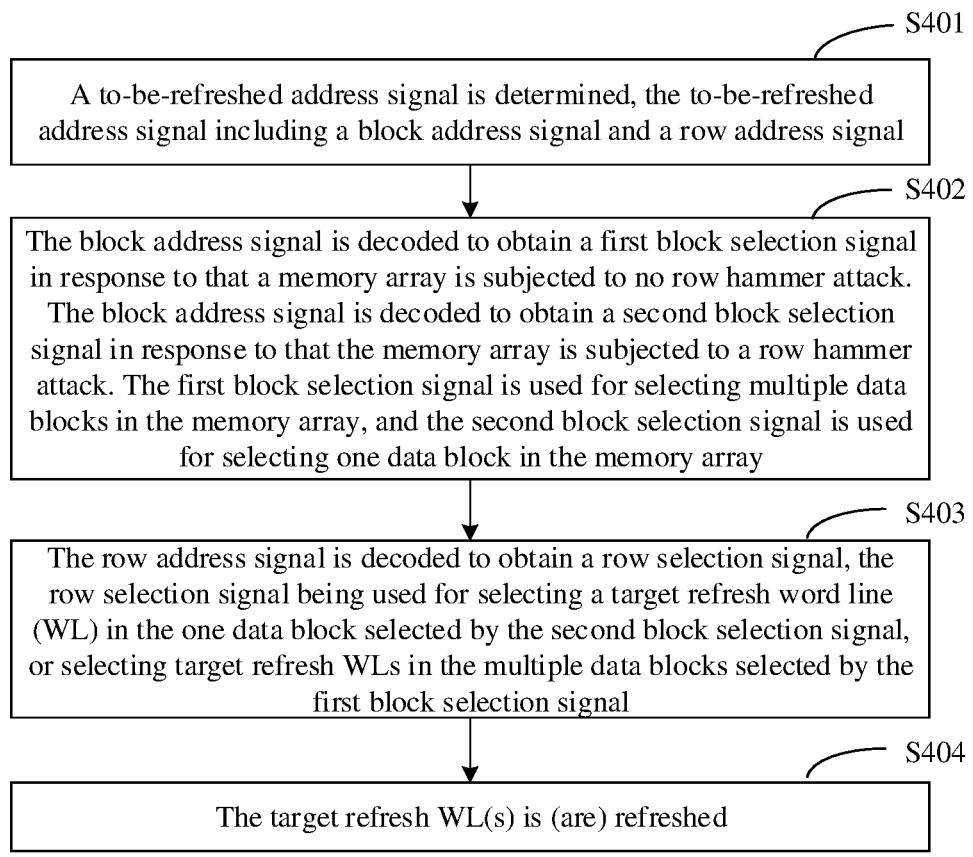
FIG. 9 illustrates a flowchart of a refresh control method according to an embodiment of present disclosure.

In another embodiment of the present disclosure, referring to FIG. 9, FIG. 9 illustrates a flowchart of a refresh control method according to an embodiment of present disclosure. As illustrated in FIG. 9, the method includes the following operations.

At S401, a to-be-refreshed address signal is determined. The to-be-refreshed address signal includes a block address signal and a row address signal.

At S402, the block address signal is decoded to obtain a first block selection signal, in response to that a memory array is subjected to no row hammer attack. The block address signal is decoded to obtain a second block selection signal, in response to that the memory array is subjected to a row hammer attack. Herein, the first block selection signal may be used for selecting multiple data blocks from the memory array, and the second block selection signal may be used for selecting one data block from the memory array.

At S403, the row address signal is decoded to obtain a row selection signal. The row selection signal may be used for selecting a target refresh WL from the one data block selected by the second block selection signal, or selecting target refresh WLs from the multiple data blocks selected by the first block selection signal.

At S404, the target refresh WL is refreshed.

It is to be noted that the refresh control method provided by the embodiment of the present disclosure is applied to the aforementioned refresh control circuit 10, and the refresh control circuit 10 is connected with the memory array. In this way, in a case where the memory array is subjected to a row hammer attack, the target refresh WL is selected from only one data block for refresh processing, which can reduce the number of irrelevant WLs being refreshed, reduce the refresh current and power consumption during the hammer refresh process, and improve the performance of a memory.

In some embodiments, S402 may specifically include the following operations.

A first row hammer signal and a refresh instruction signal are determined. Herein, in response to that the memory array is subjected to no row hammer attack, the first row hammer signal is invalid. In response to that the memory array is subjected to a row hammer attack, the first row hammer signal is valid. In response to that the first row hammer signal is invalid, first preprocessing is performed on the block address signal based on the refresh instruction signal to obtain a block preselection signal; or in response to that the first row hammer signal is valid, second preprocessing is performed based on the block address signal to obtain the block preselection signal. The block preselection signal is decoded to obtain the first block selection signal or the second block selection signal.

In some embodiments, the block address signal includes a first-type signal and a second-type signal. The block preselection signal includes a first signal pair and a second signal pair. Herein, (1) the first signal pair includes the first-type signal and an inverted signal of the first-type signal, and a level state of the first-type signal is opposite to a level state of the inverted signal of the first-type signal. (2) The second signal pair includes the second-type signal and an inverted signal of the second-type signal. In response to that the first row hammer signal is valid, a level state of the second-type signal is opposite to a level state of the inverted signal of the second-type signal. In response to that the first row hammer signal is invalid and the refresh instruction signal is valid, the second-type signal and the inverted signal of the second-type signal are both set to be in a high-level state.

In some embodiments, the first block selection signal and the second block selection signal each include multiple block selection sub-signals. Among the multiple block selection sub-signals in the first block selection signal, some block selection sub-signals are in a valid state, and the rest block selection sub-signals are in an invalid state, so as to select multiple data blocks from the memory array. Among the multiple block selection sub-signals in the second block selection signal, one block selection sub-signal is in a valid state, and the rest block selection sub-signals are in an invalid state, so as to select one data block from the memory array.

In some embodiments, the operation that the to-be-refreshed address signal is determined includes the following operations.

A general refresh address signal and an activation address signal are received. In response to that the memory array is subjected to no row hammer attack, the general refresh address signal is output as the to-be-refreshed address signal; or in response to that the memory array is subjected to a row hammer attack, the to-be-refreshed address signal is output based on the activation address signal.

It is to be noted that, when the memory array is subjected to a row hammer attack, the activation address signal is configured to indicate the attacked WL in the row hammer attack, and the to-be-refreshed address signal is configured to indicate the victim WL in the row hammer attack. Therefore, in this scenario, the to-be-refreshed address signal needs to be calculated according to the activation address signal.

The embodiments of the present disclosure provide the refresh control method. In a case where the memory array is subjected to a row hammer attack, the target refresh WL is selected from only one data block for refresh processing, which can reduce the number of irrelevant WLs being refreshed, reduce the refresh current and power consumption during the hammer refresh process, and improve the performance of the memory.

Figure 10:
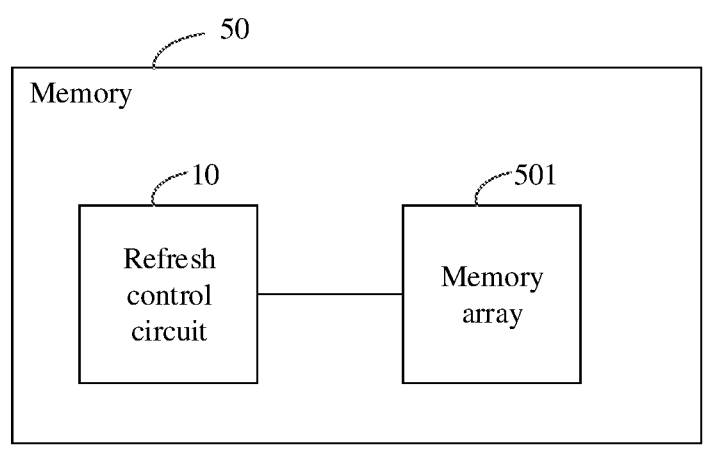
FIG. 10 illustrates a schematic structural diagram of a memory according to an embodiment of present disclosure.

In another embodiment of the present disclosure, referring to FIG. 10, FIG. 10 illustrates a schematic structural diagram of a memory 50 according to an embodiment of present disclosure. As illustrated in FIG. 10, the memory 50 includes aforementioned refresh control circuit 10 and a memory array 501. The refresh control circuit 10 is connected with the memory array 501.

For the memory 50, in response to that the memory array is subjected to a row hammer attack, the refresh control circuit 10 may select a target refresh WL from only one data block for refresh processing, which can reduce the number of irrelevant WLs refreshed, reduce the current and power consumption during the hammer refresh process, and improve the performance of the memory.

The above are only preferred embodiments of the present disclosure, and are not intended to limit the scope of protection of the present disclosure. It is to be noted that in this disclosure, the terms "comprise/comprising", "include/including", "contain/containing" or any other variations thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "comprising/including a . . . " does not exclude the existence of other identical elements in the process, method, article, or device including the element. The above numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments. The above are only detailed description of the present disclosure and are not intended to limit the scope of protection of the present disclosure. Any variation or replacement apparent to those skilled in the art within the technical scope disclosed by the disclosure shall fall within the scope of protection of the present disclosure. Therefore, the scope of protection of the present disclosure shall be subject to the scope of protection of the claims.

The embodiments of the present disclosure provide a refresh control circuit and method, and a memory, which can reduce the number of irrelevant WLs being refreshed in a hammer refresh operation and reduce refresh current and power consumption, thereby improving the performance of the memory.

What is claimed is:

1. A refresh control circuit, connected with a memory array and comprising:
   an address output circuit, configured to output a to-be-refreshed address signal, the to-be-refreshed address signal comprising a block address signal and a row address signal;
   a block decoding circuit, configured to: receive the block address signal; and decode the block address signal and output a first block selection signal, in response to that the memory array is subjected to no row hammer attack, or decode the block address signal and output a second block selection signal, in response to that the memory array is subjected to a row hammer attack; wherein the first block selection signal is used for selecting multiple data blocks from the memory array, and the second block selection signal is used for selecting one data block from the memory array; and
   a row decoding circuit, configured to receive the row address signal, decode the row address signal, and output a row selection signal, wherein the row selection signal is used for selecting a target refresh word line (WL) from the one data block selected by the second block selection signal, or selecting target refresh WLs from the multiple data blocks selected by the first block selection signal.

2. The refresh control circuit of claim 1, wherein the block decoding circuit comprises:
   a preprocessing circuit, configured to receive a first row hammer signal, a refresh instruction signal and the block address signal; in response to that the first row hammer signal is invalid, perform first preprocessing on the block address signal based on the refresh instruction signal to obtain a block preselection signal, or in response to that the first row hammer signal is valid, perform second preprocessing based on the block address signal to obtain the block preselection signal; and
   a decoding circuit, configured to receive the block preselection signal, and decode the block preselection signal to obtain the first block selection signal or the second block selection signal;
   wherein in response to that the memory array is subjected to no row hammer attack, the first row hammer signal is invalid; and in response to that the memory array is subjected to a row hammer attack, the first row hammer signal is valid.

3. The refresh control circuit of claim 2, wherein the block address signal comprises a first-type signal and a second-type signal, and the block preselection signal comprises a first signal pair and a second signal pair; and
   the preprocessing circuit comprises:
   a first processing circuit, configured to receive the first-type signal, perform logical processing on the first-type signal, and output the first signal pair; wherein the first signal pair comprises the first-type signal and an inverted signal of the first-type signal, and a level state of the first-type signal is opposite to a level state of the inverted signal of the first-type signal; and
   a second processing circuit, configured to receive the first row hammer signal, the refresh instruction signal and the second-type signal; and perform the first preprocessing or the second preprocessing on the second-type signal based on the first row hammer signal and the refresh instruction signal, and output the second signal pair;

wherein the second signal pair comprises the second-type signal and an inverted signal of the second-type signal; in response to that the first row hammer signal is valid, a level state of the second-type signal is opposite to a level state of the inverted signal of the second-type signal are opposite; and in response to that the first row hammer signal is invalid and the refresh instruction signal is valid, the second-type signal and the inverted signal of the second-type signal are both set to be in a high-level state.

4. The refresh control circuit of claim 3, wherein the first processing circuit comprises a first NOT gate, an input end of the first NOT gate receives the first-type signal, and an output end of the first NOT gate outputs the inverted signal of the first-type signal.

5. The refresh control circuit of claim 3, wherein the second processing circuit comprises:

an enable circuit, configured to receive the first row hammer signal and the refresh instruction signal, and output an operation control signal; wherein in response to that the first row hammer signal is invalid and the refresh instruction signal is valid, the operation control signal is valid, and in response to that the first row hammer signal is valid, the operation control signal is invalid; and a logic circuit, configured to receive the operation control signal and the second-type signal; perform the first preprocessing on the second-type signal and output the second signal pair, in response to that the operation control signal is valid; and perform the second preprocessing on the second-type signal and output the second signal pair, in response to that the operation control signal is invalid.

6. The refresh control circuit of claim 5, wherein the enable circuit comprises a second NOT gate, a first NAND gate and a third NOT gate; and an input end of the second NOT gate receives the first row hammer signal, a first input end of the first NAND gate is connected with an output end of the second NOT gate, a second input end of the first NAND gate receives the refresh instruction signal, an output end of the first NAND gate is connected with the input end of the third NOT gate, and an output end of the third NOT gate is configured to output the operation control signal.

7. The refresh control circuit of claim 5, wherein the logic circuit comprises a fourth NOT gate, a second NAND gate, a fifth NOT gate, and a third NAND gate;

the fourth NOT gate receives the operation control signal, a first input end of the second NAND gate is connected with an output end of the fourth NOT gate, a second input end of the second NAND gate receives the second-type signal, and an output end of the second NAND gate is configured to output the inverted signal of the second-type signal; and an input end of the fifth NOT gate receives the second-type signal, a first input end of the third NAND gate is connected with an output end of the fourth NOT gate, a second input end of the third NAND gate is connected with an output end of the fifth NOT gate, and an output end of the third NAND gate is configured to output a new second-type signal.

8. The refresh control circuit of claim 2, wherein the first block selection signal and the second block selection signal each comprise multiple block selection sub-signals;

among the multiple block selection sub-signals in the first block selection signal, some block selection sub-signals are in a valid state, and the rest block selection sub-signals are in an invalid state, so as to select multiple data blocks from the memory array; and among the multiple block selection sub-signals in the second block selection signal, one block selection sub-signal is in a valid state, and the rest block selection sub-signals are in an invalid state, so as to select one data block from the memory array.

9. The refresh control circuit of claim 8, wherein the decoding circuit comprises multiple decoding sub-circuits;

each of the multiple decoding sub-circuits is configured to receive some signals in the block preselection signal, perform logical operation on the received signals, and output a respective block selection sub-signal, wherein each of the multiple decoding sub-circuits receives respective different signals;

wherein in response to that a result of the logic operation is a preset value, the block selection sub-signal output by the decoding sub-circuit is in a valid state.

10. The refresh control circuit of claim 1, wherein:

the address output circuit is configured to receive a general refresh address signal and an activation address signal; and in response to that the memory array is subjected to no row hammer attack, output the general refresh address signal as the to-be-refreshed address signal, or in response to that the memory array is subjected to a row hammer attack, output the to-be-refreshed address signal based on the activation address signal.

11. The refresh control circuit of claim 10, wherein the address output circuit comprises:

a control circuit, configured to receive the activation address signal, a second row hammer signal and a first control signal; and in response to that the second row hammer signal is valid, perform calculation on the activation address signal based on the first control signal and output a victim address signal; and a selection circuit, configured to receive the general refresh address signal, the victim address signal and the second control signal; and in response to that the second control signal is in a first state, output the general refresh address signal as the to-be-refreshed address signal, or in response to that the second control signal is in a second state, output the victim address signal as the to-be-refreshed address signal;

wherein the second row hammer signal represents that the memory array is subjected to a row hammer attack.

12. The refresh control circuit of claim 11, wherein the control circuit comprises a latch and a calculation circuit; wherein an input end of the latch receives the activation address signal, a clock end of the latch receives the second row hammer signal, an output end of the latch is connected with an input end of the calculation circuit, and a control end of the calculation circuit receives the first control signal; and a first input end of the selection circuit receives the general refresh address signal, a second input end of the selection circuit is connected with an output end of the calculation circuit, a control end of the selection circuit is connected with the second control signal, and an output end of the selection circuit is configured to output the to-be-refreshed address signal.

13. The refresh control circuit of claim 12, wherein the selection circuit further comprises a third input end connected with the activation address signal; and the selection circuit is configured to:
   output the activation address signal as the to-be-refreshed address signal, in response to that the second control signal is in a third state.

14. A refresh control method, applied to a refresh control circuit and connected with a memory array, and comprising:
   determining a to-be-refreshed address signal, the to-be-refreshed address signal comprising a block address signal and a row address signal;
   decoding the block address signal to obtain a first block selection signal in response to that the memory array is subjected to no row hammer attack; and decoding the block address signal to obtain a second block selection signal in response to that the memory array is subjected to a row hammer attack; wherein the first block selection signal is used for selecting multiple data blocks from the memory array, and the second block selection signal is used for selecting one data block from the memory array;
   decoding the row address signal to obtain a row selection signal, wherein the row selection signal is used for selecting a target refresh word line (WL) from the one data block selected by the second block selection signal, or selecting target refresh WLs from the multiple data blocks selected by the first block selection signal; and
   refreshing the target refresh WL(s).

15. The refresh control method of claim 14, wherein the decoding the block address signal to obtain a first block selection signal in response to that the memory array is subjected to no row hammer attack; and decoding the block address signal to obtain a second block selection signal in response to that the memory array is subjected to a row hammer attack comprises:
   determining a first row hammer signal and a refresh instruction signal, wherein in response to that the memory array is subjected to no row hammer attack, the first row hammer signal is invalid, and in response to that the memory array is subjected to a row hammer attack, the first row hammer signal is valid;
   in response to that the first row hammer signal is invalid, performing first preprocessing on the block address signal based on the refresh instruction signal to obtain a block preselection signal; or in response to that the first row hammer signal is valid, performing second preprocessing based on the block address signal to obtain the block preselection signal; and
   decoding the block preselection signal to obtain the first block selection signal or the second block selection signal.

16. The refresh control method of claim 14, wherein the determining a to-be-refreshed address signal comprises:
   receiving a general refresh address signal and an activation address signal; and
   in response to that the memory array is subjected to no row hammer attack, outputting the general refresh address signal as the to-be-refreshed address signal; or in response to that the memory array is subjected to a row hammer attack, outputting the to-be-refreshed address signal based on the activation address signal.

17. A memory, comprising a refresh control circuit and a memory array, the refresh control circuit being connected with the memory array and comprising:
   an address output circuit, configured to output a to-be-refreshed address signal, the to-be-refreshed address signal comprising a block address signal and a row address signal;
   a block decoding circuit, configured to: receive the block address signal; and decode the block address signal and output a first block selection signal, in response to that the memory array is subjected to no row hammer attack, or decode the block address signal and output a second block selection signal, in response to that the memory array is subjected to a row hammer attack; wherein the first block selection signal is used for selecting multiple data blocks from the memory array, and the second block selection signal is used for selecting one data block from the memory array; and
   a row decoding circuit, configured to receive the row address signal, decode the row address signal, and output a row selection signal, wherein the row selection signal is used for selecting a target refresh word line (WL) from the one data block selected by the second block selection signal, or selecting target refresh WLs from the multiple data blocks selected by the first block selection signal.

18. The memory of claim 17, wherein the block decoding circuit comprises:
   a preprocessing circuit, configured to receive a first row hammer signal, a refresh instruction signal and the block address signal; in response to that the first row hammer signal is invalid, perform first preprocessing on the block address signal based on the refresh instruction signal to obtain a block preselection signal, or in response to that the first row hammer signal is valid, perform second preprocessing based on the block address signal to obtain the block preselection signal; and
   a decoding circuit, configured to receive the block preselection signal, and decode the block preselection signal to obtain the first block selection signal or the second block selection signal;
   wherein in response to that the memory array is subjected to no row hammer attack, the first row hammer signal is invalid; and in response to that the memory array is subjected to a row hammer attack, the first row hammer signal is valid.

19. The memory of claim 18, wherein the block address signal comprises a first-type signal and a second-type signal, and the block preselection signal comprises a first signal pair and a second signal pair; and
   the preprocessing circuit comprises:
   a first processing circuit, configured to receive the first-type signal, perform logical processing on the first-type signal, and output the first signal pair; wherein the first signal pair comprises the first-type signal and an inverted signal of the first-type signal, and a level state of the first-type signal is opposite to a level state of the inverted signal of the first-type signal; and
   a second processing circuit, configured to receive the first row hammer signal, the refresh instruction signal and the second-type signal; and perform the first preprocessing or the second preprocessing on the second-type signal based on the first row hammer signal and the refresh instruction signal, and output the second signal pair;

wherein the second signal pair comprises the second-type signal and an inverted signal of the second-type signal; in response to that the first row hammer signal is valid, a level state of the second-type signal is opposite to a level state of the inverted signal of the second-type signal are opposite; and in response to that the first row hammer signal is invalid and the refresh instruction signal is valid, the second-type signal and the inverted signal of the second-type signal are both set to be in a high-level state.

20. The memory of claim 19, wherein the first processing circuit comprises a first NOT gate, an input end of the first NOT gate receives the first-type signal, and an output end of the first NOT gate outputs the inverted signal of the first-type signal.

* * * * *